US010424459B2

(12) United States Patent
Li et al.

(10) Patent No.: US 10,424,459 B2
(45) Date of Patent: Sep. 24, 2019

(54) CHARGED PARTICLE BEAM DEVICE

(71) Applicant: Hitachi High-Technologies Corporation, Minato-ku, Tokyo (JP)

(72) Inventors: Wen Li, Tokyo (JP); Ryo Kadoi, Tokyo (JP); Kazuki Ikeda, Tokyo (JP); Hiroyuki Takahashi, Tokyo (JP); Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/613,941

(22) Filed: Jun. 5, 2017

(65) Prior Publication Data

US 2017/0271121 A1    Sep. 21, 2017

Related U.S. Application Data

(63) Continuation of application No. 15/109,230, filed as application No. PCT/JP2014/083200 on Dec. 16, 2014, now Pat. No. 9,679,740.

(30) Foreign Application Priority Data

Jan. 9, 2014    (JP) ................................ 2014-002260

(51) Int. Cl.
*H01J 37/147*    (2006.01)
*H01J 37/28*    (2006.01)
*H01J 37/244*    (2006.01)

(52) U.S. Cl.
CPC ........ *H01J 37/1472* (2013.01); *H01J 37/244* (2013.01); *H01J 37/28* (2013.01);
(Continued)

(58) Field of Classification Search
CPC .. H01J 37/28; H01J 37/244; H01J 2237/2804; H01J 2237/2806; H01J 2237/152; H01J 2237/1504

(Continued)

(56) References Cited

U.S. PATENT DOCUMENTS 7,022,983 B2    4/2006    Ose et al.
9,679,740 B2 *    6/2017    Li ....................... H01J 37/1472
(Continued)

FOREIGN PATENT DOCUMENTS

| JP | 2-60042 A | 2/1990 |
| JP | 2-142045 A | 5/1990 |
| JP | 2006-332038 A | 12/2006 |

OTHER PUBLICATIONS

International Search Report (PCT/ISA/210) issued in PCT Application No. PCT/JP2014/083200 dated Jan. 20, 2015 with English-language translation (two (2) pages).
(Continued)

*Primary Examiner* — Nicole M Ippolito
(74) *Attorney, Agent, or Firm* — Crowell & Moring LLP

(57) ABSTRACT

A processing apparatus and a processing method are provided, which use a charged particle beam device that achieves deflection of secondary electrons/reflected electrons at a large angle and cancels out noises of an electromagnetic deflector and an electrostatic deflector to suppress a position shift of a primary electron beam caused by circuit noises of a primary beam/secondary beam separation circuit. In the charged particle beam device that includes an electronic optical system radiating a concentrated electron beam onto a sample placed on a stage to perform scanning and captures an image of the sample, a reference signal and a signal generation unit of a voltage-source control signal applied to the electrostatic deflector generating the electrostatic deflector and a reference signal and a signal generation unit of a current-source control signal applied to the electromagnetic deflector generating a magnetic field are made common in an overlapping-electromagnetic-deflector control unit that controls a path of the secondary electrons/reflected electrons incident on a detector, and frequency characteristics and phase characteristics of the voltage control signal are coincident with those of the current-source control signal.

6 Claims, 8 Drawing Sheets

(52) U.S. Cl.
CPC . *H01J 2237/152* (2013.01); *H01J 2237/1504* (2013.01); *H01J 2237/1508* (2013.01); *H01J 2237/1534* (2013.01); *H01J 2237/2804* (2013.01); *H01J 2237/2806* (2013.01)

(58) Field of Classification Search
USPC ......... 250/396 R, 397, 492.1, 492.2, 492.21, 250/492.22, 492.23, 492.3
See application file for complete search history.

(56) References Cited

U.S. PATENT DOCUMENTS

| | | |
|---|---|---|
| 2006/0243906 A1 | 11/2006 | Fukada et al. |
| 2007/0181806 A1 | 8/2007 | Nakano et al. |
| 2008/0237465 A1 | 10/2008 | Hatano et al. |
| 2008/0283744 A1 | 11/2008 | Takada et al. |
| 2010/0072387 A1 | 3/2010 | Sawada et al. |
| 2010/0320382 A1 | 12/2010 | Almogy et al. |

OTHER PUBLICATIONS

Japanese-language Written Opinion (PCT/ISA/237) issued in PCT Application No. PCT/JP2014/083200 dated Jan. 20, 2015 (four (4) pages).

\* cited by examiner

CHARGED PARTICLE BEAM DEVICE

CROSS REFERENCE

This application is a continuation of U.S. application Ser. No. 15/109,230, filed Jun. 30, 2016, which is a National Stage Application of PCT International No. PCT/JP2014/083200, filed Dec. 16, 2014, which claims priority to Japanese Patent Application No. 2014-002260, filed Jan. 9, 2014, the disclosures of which are expressly incorporated by reference herein.

TECHNICAL FIELD

The present invention relates to a metrology/inspection apparatus that performs a process, e.g., measurement, observation, or inspection of a sample (an object), such as a semiconductor substrate (wafer), and a metrology/inspection method using the apparatus to perform the measurement or the inspection, for example. In particular, the present invention relates to a processing apparatus that captures an image of the sample using a scanning electron microscope apparatus (hereinafter, called SEM) as one of charged particle devices and performs the measurement, the observation, or the inspection and a metrology/inspection method thereof.

BACKGROUND ART

In a semiconductor manufacturing process, circuit patterns formed on a semiconductor substrate (wafer) are rapidly becoming finer, and importance of process monitoring that monitors whether or not the patterns are formed as designed, for example, is increasing. For example, measurement and inspection of the circuit patterns or the like on the wafer are performed at the end of each manufacturing step in order to detect occurrence of an abnormality or a failure (a defect) in the semiconductor manufacturing process early or in advance.

During the above measurement and inspection, in a metrology/inspection apparatus, e.g., an SEM using a scanning electron beam technique, and a corresponding metrology/inspection method, a primary electron beam (an electron beam) is radiated to a sample such as the wafer to be measured/inspected while the sample is scanned with the primary electron beam, and an energy such as secondary electrons/reflection generated by this radiation is detected. An image (a measurement image or an inspection image) is then generated based on that detection by signal processing and image processing, and the measurement, observation, or the inspection is performed based on that image.

In the aforementioned metrology apparatus using the scanning electron beam technique, it is necessary to deflect the secondary electrons/reflected electrons (a secondary beam) generated from the sample towards a detector in order to detect the secondary electrons/reflected electrons with a high efficiency. Meanwhile, when a unit deflecting the secondary beam towards a predetermined direction affects the primary beam, a shift of a radiation position of the primary beam on the sample occurs, lowering a measurement accuracy of the apparatus. Therefore, a unit separating the primary beam and the secondary beam from each other is required, which deflects the secondary electrons/reflected electrons, i.e., the secondary electron beam, towards a direction to which the detector is arranged but does not deflect the primary beam radiated to a predetermined position of the sample.

A technique described in Japanese Unexamined Patent Application Publication No. 2006-332038 (Patent Literature 1) is an example of a conventional technique related to the above measurement and inspection and control of separation of the primary electron beam and the secondary electron beam.

Patent Literature 1 describes that, in an electromagnetic overlapping objective lens that can have an improved resolution, secondary electrons generated from a sample are accelerated, so that dependence of a rotation operation by the objective lens on secondary electron energy is suppressed. Also, it is described that, when a low elevation angle component and a high elevation angle component, seen from a portion of generation of the secondary electrons, and an azimuth component are chosen and detected by an annular detector provided between an electron source and the objective lens, a central axis of the secondary electrons concentrated by acceleration to be thinner is made coincident with a central axis of a low-elevation-angle signal detection system, and the secondary electrons are adjusted and deflected by ExB to avoid a hole in a high-elevation-angle signal detection system.

CITATION LIST

Patent Literature

Patent Literature 1: Japanese Unexamined Patent Application Publication No. 2006-332038

SUMMARY OF INVENTION

Technical Problem

In the metrology apparatus using the SEM, improvement of the resolution of the measurement accuracy and improvement of visibility of deep grooves and holes are demanded, as the circuit patterns formed on the wafer to be measured are becoming finer and materials for the circuit patterns are becoming more various. The improvement of the resolution requires improvement of an accuracy of scanning with the primary electron beam, that is, reduction of a position shift in the scanning with the primary electron beam. The improvement of the visibility of the deep grooves and holes requires deflection of the secondary beam at a high angle (a large angle) in order to perform highly efficient detection of the secondary electrons/reflected electrons. In other words, a control circuit with a high voltage and a large current that makes an electric field and a magnetic field for deflecting the secondary beam is essential.

Japanese Unexamined Patent Application Publication No. 2006-332038 describes, as to the control of separation of the primary electron beam and the secondary electron beam, a method that cancels out effects of an orthogonal electromagnetic field generator on the primary electron beam and generates a magnetic field in a direction orthogonal to an electric field so that the secondary electrons are directed to the detector side, for example. However, there is no disclosure of a solution of a problem that, in a voltage-source circuit controlling an electric-field deflector and a control current-source circuit a magnetic-field deflector, circuit noises generated in a circuit component cause the position shift in the scanning with the primary electron beam.

Thus, the present invention provides a processing apparatus and a processing method using a scanning electron microscope, which achieves deflection of secondary electrons/reflected electrons at a large angle and cancels out noises of an electromagnetic deflector and an electrostatic deflector to suppress a position shift of a primary electron beam caused by circuit noises in a primary beam/secondary beam separation circuit.

Solution to Problem

For solving the above problems, main features of a charged particle beam device according to the present invention are as follows.

A charged particle gun that generates a charged particle beam, an electronic optical system that radiates the charged particle beam emitted from the charged particle gun onto a sample placed on a stage and performs scanning with the charged particle beam, a detection unit that detects secondary electrons or reflected electrons generated from the sample, and an orthogonal electromagnetic deflection unit that deflects a traveling path of the secondary electrons or the reflected electrons towards the detection unit are included. The orthogonal electromagnetic deflection unit includes a magnetic-field deflector generating a magnetic field to change a path of the charged particle beam, an electric-field deflector generating an electric field to change the path of the charged particle beam, a current-source circuit supplying a current to the magnetic-field deflector, a voltage-source circuit supplying a voltage to the electric-field deflector, and a gain adjustment unit adjusting a relation between the current and the voltage. The magnetic-field deflector and the electric-field deflector are arranged in such a manner that the magnetic field and the electric field are orthogonal to each other and overlap each other. A voltage generation unit applying a voltage to the current-source circuit and a voltage generation unit applying a voltage to the voltage-source circuit are formed as a one common unit. The relation between the current and the voltage is adjusted by the gain adjustment unit in such a manner that an amount of deflection of the traveling path by the magnetic field is coincident with an amount of deflection of the traveling path by the electric field.

With the above configuration, the charged particle beam device according to the present invention has a function of controlling measurement corresponding to a high throughput and a high resolution, and provides a solution of a problem that, in the voltage-source circuit controlling the electric-field deflector and the control current-source circuit the magnetic-field deflector that deflect an electron beam, circuit noises generated in a circuit component causes a position shift in scanning with a primary electron beam.

More specifically, according to the present invention, as a measure for solving the problem of the position shift in the scanning with the primary electron beam caused by an electromagnetic overlapping deflector that makes a magnetic field generated by a current-controlled coil and an electric field generated by voltage control orthogonal to each other (hereinafter, called an orthogonal electromagnetic deflector) in order to improve the resolution and the throughput, a unit generating a voltage-source control signal applied to an electrostatic deflector that generates a static electric field and a unit generating a current-source control signal applied to an electromagnetic deflector that generates a static magnetic field are formed as a common unit, and frequency characteristics and phase characteristics of the voltage control signal and those of the current-source control signal are made coincident with each other. This measure reduces the shift of the primary electron beam caused by the circuit noises, so that measurement with a high resolution and a high throughput is achieved.

Advantageous Effects of Invention

According to the present invention, a processing apparatus and a processing method using a scanning electron microscope can be provided, which achieves deflection of secondary electrons/reflected electrons at a large angle and cancels out noises of an electromagnetic deflector and an electrostatic deflector to suppress a position shift of a primary electron beam caused by circuit noises in a primary beam/secondary beam separation circuit.

DESCRIPTION OF EMBODIMENTS

Figure 1:
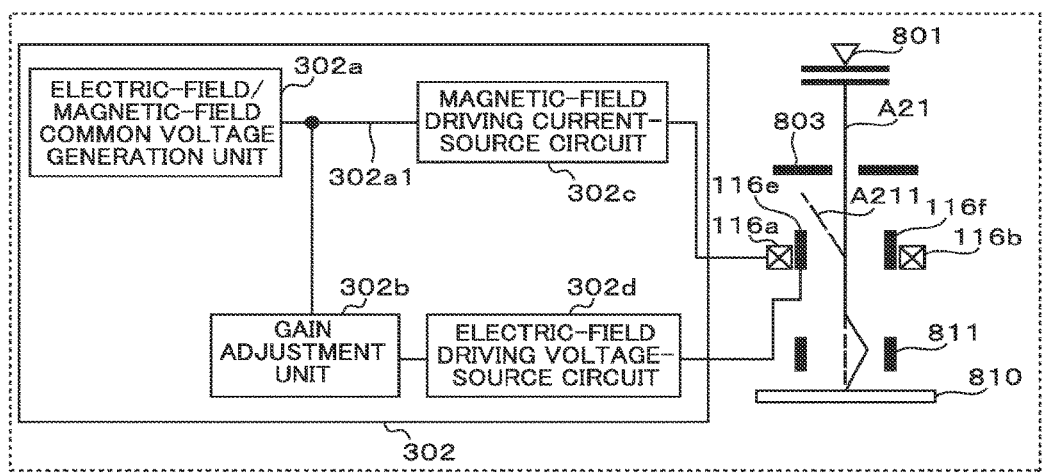
FIG. 1 is a block diagram showing a combination of an orthogonal electromagnetic deflector and a control circuit thereof according to a first embodiment of the present invention.

Embodiments of the present invention are described below in detail, referring to the drawings. Throughout the drawings for describing the embodiments, the same parts are labeled with the same reference signs in principle and the redundant description is omitted. In the following description, a metrology/observation/inspection apparatus and a metrology/observation/inspection method include a case where any one of metrology, observation, and inspection is provided or a case where a combination of them is provided.

Figure 8:
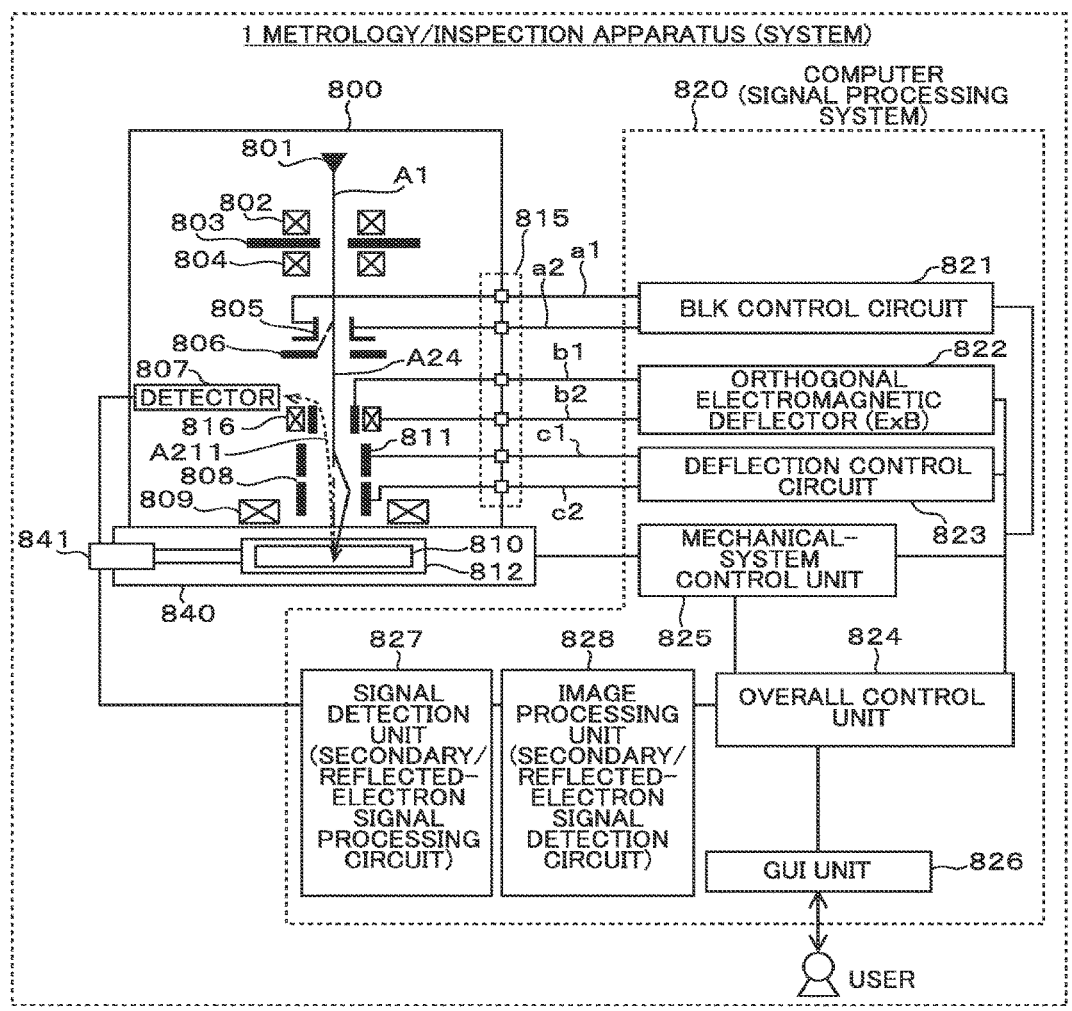
FIG. 8 is a block diagram showing an overall configuration of a system including the conventional scanning electron beam type semiconductor metrology/inspection apparatus.

A metrology/inspection apparatus using a scanning electron beam technique according to the present invention includes a conventional metrology/inspection apparatus (system) using a scanning electron beam technique shown in FIG. 8 as a basic configuration and employs a configuration of a control circuit of an orthogonal electromagnetic deflector according to the present invention in that basic configuration. Therefore, the system configuration in FIG. 8 is described first.

The conventional metrology/inspection apparatus (system) is roughly formed by a scanning electron microscope 800 and a computer 820.

The scanning electron microscope 800 includes a lens barrel 830 and a sample chamber 840. In the inside of the lens barrel 830, an electron gun 801 that emits an electron beam A21, and a concentrating lens (a first condenser lens) 802, a diaphragm 803, a concentrating lens (a second condenser lens) 804, a blanking control electrode 805, an aperture 806, a deflection electrode 808, and an objective lens 809 through which the emitted electron beam A21 passes are provided as a radiation system (an electronic optical system). The lens barrel 830 is also provided with a detector 807 that detects secondary electrons A211 generated from a sample 810 by the radiated electron beam A21 (A24), as a detection system. Further, an orthogonal electromagnetic field generator (E×B) 816 is provided as a unit that separates a primary beam and a secondary beam from each other.

The computer 820 includes an overall control unit 824, a blanking (BLK) control circuit 821, an orthogonal electromagnetic deflector (E×B) 822, a deflection control circuit 823, a mechanical-system control unit 825, a signal detection unit (a secondary-electron signal detection circuit) 827, an image processing unit (a secondary-electron signal processing circuit) 828, a stage position detection unit (not shown), an electronic-optical-system control unit (not shown), and a GUI unit (a user interface unit) 826, for example.

Inside the lens barrel 830 (in a vacuum state), the electron beam A21 generated and emitted by the electron gun 801 is concentrated thorough the first condenser lens (the concentrating lens) 802, the diaphragm 803, and the second condenser lens (the concentrating lens) 804, subjected to movement and scan-deflection control at a radiation center of the beam by means of the deflection electrode 808, and radiated onto the sample 810 through the objective lens 809, for example, while the sample 810 is scanned with the beam. When the beam A21 (A24) is radiated, the secondary electrons A211 are generated from the sample 810, and incident on the deflector 807 because of a deflection operation of the orthogonal electromagnetic deflector (E×B) 822, thereby being detected. A signal (an analog signal) output from the detector 807 by the detection of the secondary electrons A211 is converted to a digital signal by the signal detection unit (the secondary-electron signal detection circuit) 827. A two-dimensional image is generated and processed based on that digital signal by the image processing unit (the secondary-electron signal processing circuit) 828, and a result of the processing is displayed on a screen of the GUI unit 826. A circuit pattern is measured based on this image (in the case of a metrology function).

The GUI unit 826 performs a process that provides an interface (e.g., a GUI screen) to a user (a measurer/inspector). The GUI unit 826 provides a GUI screen that allows an inspection condition or the like to be input (set) and a GUI screen displaying an inspection result (e.g., a two-dimensional image).

The overall control unit 824 performs a process of controlling the whole of this system (apparatus) in accordance with an instruction input through the GUI unit 826. The electronic-optical-system control unit (not shown) controls the electronic optical system (the radiation system) in the lens barrel 830 in accordance with the control from the overall control unit 824. The mechanical-system control unit 825 controls a mechanical system including a motor 841 that drives a sample stage 812 arranged in the sample chamber 840, for example. A rotation signal of the motor 841 is sent to the stage-position detection unit (not shown), so that position information of the sample stage (stage) 812 is obtained.

In the conventional metrology/inspection apparatus using the scanning electron beam technique, as shown in FIG. 8, the electromagnetic deflector (E×B) is employed as a unit that separates the primary beam and the secondary beam from each other, which makes a magnetic field generated by a current-controlled coil and an electric field generated by voltage control orthogonal to each other.

Figure 3:
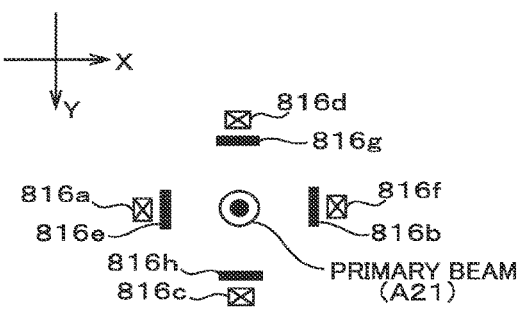
FIG. 3 is a block diagram showing a bird's-eye view of a configuration of electric-field electrodes and magnetic-field coils in an orthogonal electromagnetic deflector and a primary beam and a secondary beam in scanning electron beam type semiconductor metrology/inspection apparatuses according to the present invention and a conventional technique.
Figure 4:
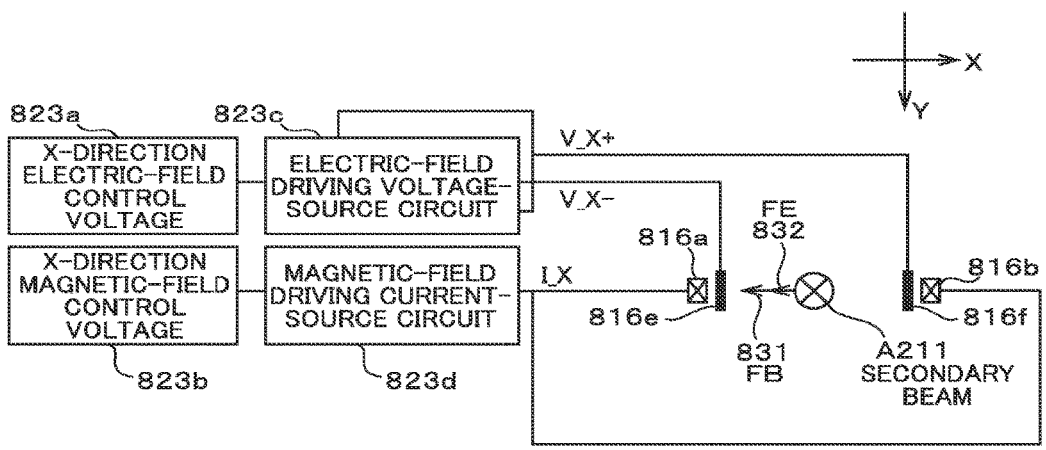
FIG. 4 is a block diagram showing a configuration of the orthogonal electromagnetic deflector in X direction and a deflecting force for the secondary beam in the conventional scanning electron beam type semiconductor metrology/inspection apparatus.
Figure 5:
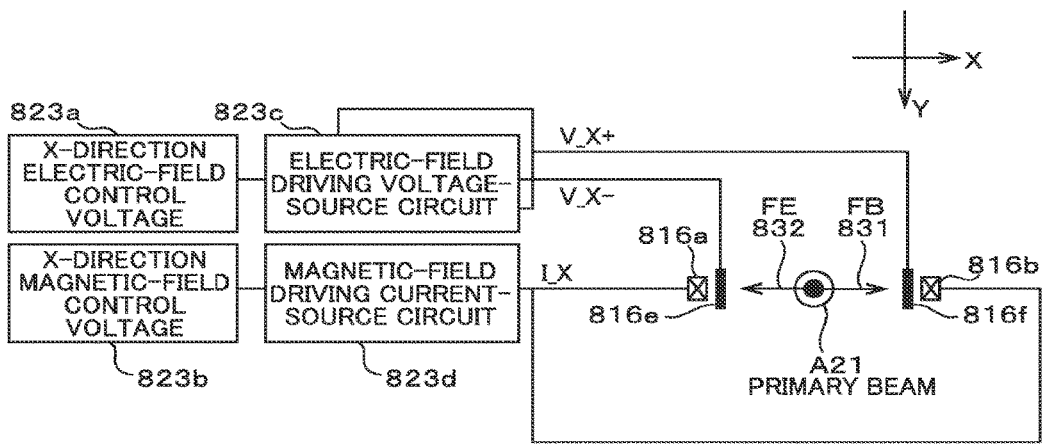
FIG. 5 is a block diagram showing the configuration of the orthogonal electromagnetic deflector in X direction and a deflecting force for the primary beam in the conventional scanning electron beam type semiconductor metrology/inspection apparatus.

A separation and deflection operation provided by the orthogonal electromagnetic deflector (E×B) 822 to the primary beam and the secondary beam is described here, with reference to FIGS. 3, 4, and 5. The orthogonal electromagnetic deflector (E×B) is generally arranged in each of X-direction and Y-direction, as shown in FIG. 3, to be able to deflect the secondary beam to an arbitrary direction. Note that only an electromagnetic deflector and an electric-field deflector and control circuits therefor in X-direction are shown in the explanation in FIGS. 4 and 5 for the sake of simplification, and those in Y-direction are omitted. FIG. 4 is a bird's-eye view of the orthogonal electromagnetic deflector and the secondary beam A211. FIG. 5 is a bird's-eye view of the orthogonal electromagnetic deflector and the primary beam A21.

When a potential difference of ±Vx (V) is applied across an electrode 816e and a counter electrode 816f of the electric-field deflector of the orthogonal electromagnetic deflector to generate an electric field E, the primary electron beam A21 with an acceleration voltage Vacc is subjected to a deflecting force toward the same direction as the generated electric field E and is therefore deflected by an angle of $\theta e = Ke \cdot Ve/Vacc$ that is proportional to Ve/Vacc. Note that Ve represents an inter-electrode voltage in the electric-field deflector and Ke represents a constant determined by the shapes and the arrangements of the electrode 816e and the counter electrode 816f.

Meanwhile, when an exciting current Ix (A) is made to flow through orthogonal magnetic-field generating coils 816a and 816b, a magnetic field B that is orthogonal to the electric field E is generated, so that the primary electron beam A21 is deflected towards an opposite direction to the deflection by the electric field, by an angle of $\theta b = Kb \cdot Ix/\sqrt{Vacc}$ that is proportional to $Ix/\sqrt{Vacc}$. Note that Kb represents a constant determined by the shapes and the arrangements of the orthogonal magnetic-field generating coils

816a and 816b. In a case where the electric field E and the magnetic field B that are orthogonal to each other are present at the same time, a path of the primary electron beam is determined by synthesis of the forces by the electric field E and the magnetic field B. Therefore, when θe and θb are set to satisfy θe=θb, the primary electron beam travels straight without being affected by the deflection operation.

Meanwhile, the secondary electrons (or reflected electrons) A211 generated from the sample 810 travel in an opposite direction to the primary electrons A21. Therefore, the direction of deflection by the electric field and that by the magnetic field are the same, so that the secondary electrons A211 are deflected towards the electrode. An angle of the deflection depends on the energy of the secondary electrons (or the reflected electrons) A211. It is enough that the condition where the primary electrons are not deflected, i.e., θe=θb is satisfied and a relation between a voltage Vx and a current Ib is set to satisfy Vx=K·Vacc and Ix=K·(Ke/Kb)·√Vacc, where K represents a constant determining the angle of deflection of the secondary electrons or the reflected electrons. When Vacc is constant, the relation can be rewritten to Vx=Kx·Ix. The condition satisfying this relation is referred to as the "Wien condition" in the following description.

This Wien condition is a condition where the electric field and the magnetic field generated by the orthogonal electromagnetic deflector cancel out effects on the primary beam. Kx depends on the shapes and the arrangements of the electrodes, and the states and the arrangements of the coils in the orthogonal electromagnetic deflector, and an acceleration speed of the primary beam.

In a case where the orthogonal electromagnetic deflector is arranged in each of X-direction and Y-direction as shown in FIG. 3, so that it can deflect the secondary beam to an arbitrary direction, the Wien condition also includes constraints represented by the following Expressions 1 and 2 between the voltage in X-direction and the current in Y-direction, other than the relation between the electric-field control voltage and the magnetic-field control current in the same direction.

$$Vx = K1 \cdot Ix + K2 \cdot Iy \quad \text{(Expression 1)}:$$

$$Vy = K3 \cdot Ix + K4 \cdot Iy \quad \text{(Expression 2)}:$$

These are caused by manufacturing and mounting errors of the electrodes and the coils in X-direction and those in Y-direction.

K1, K2, K3, and K4 in the above expressions satisfy the following relations.

K1>>K2, and K1>>K3, and K4>>K2, and K4>>K3 Because K1, K2, K3, and K4 depend on the manufacturing and mounting errors of the electrodes and the coils, adjustment is required first after the electrodes and the coils are mounted on the apparatus.

Because the amount of deflection is inversely proportional to the acceleration voltage Vacc because of the electric field, and is inversely proportional to the square root of the acceleration voltage Vacc because of the magnetic field, K1, K2, K3, and K4 have to be adjusted in accordance with the acceleration voltage Vacc of the primary beam.

Therefore, the conventional apparatus has a feature that, for allowing arbitrary adjustment of a relation between a value of a voltage controlling the electric field and a value of a current controlling the magnetic field, generation circuits are independent with each other.

Meanwhile, in a voltage-source circuit that controls the electric-field deflector and a control current-source circuit the magnetic-field deflector, circuit noises generated in elements constituting the circuits cause a position shift in scanning with the primary electron beam.

A relation between the noises in the control circuit of the orthogonal electromagnetic deflector and the scanning error of the primary electron beam is described with reference to FIGS. 6 and 7. Although the description is made referring to X-direction of a one-stage orthogonal electromagnetic deflector in FIGS. 6 and 7, the relation between the noises in the deflector control circuit and the scanning shift of the primary electron beam is not limited to a configuration using a multi-stage orthogonal electromagnetic deflector or X-direction.

Figure 6:
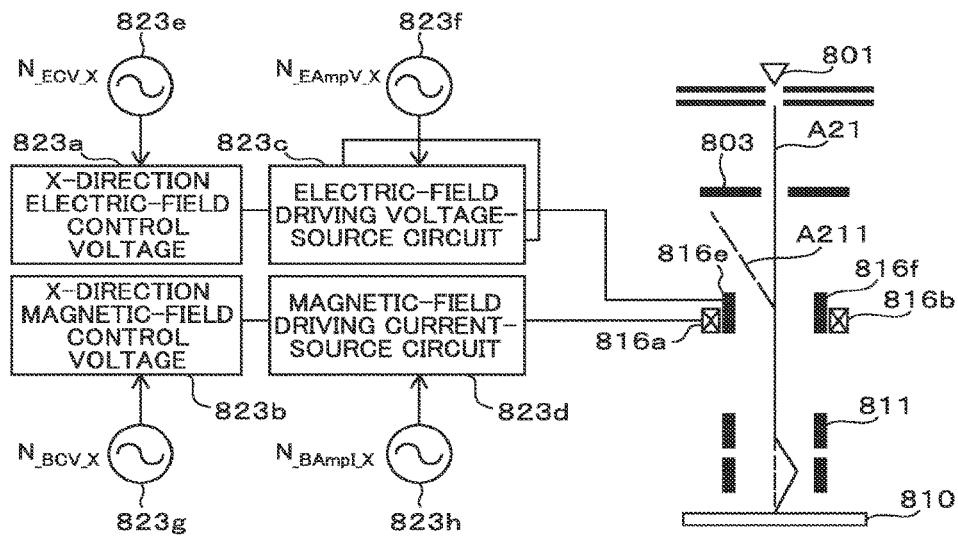
FIG. 6 is a block diagram showing noises in a control circuit of the X-direction orthogonal electromagnetic deflector of the conventional scanning electron beam type semiconductor metrology/inspection apparatus.

In the orthogonal electromagnetic deflector shown in FIG. 6, an electron-beam deflection amount Lex on a sample (wafer) is given by the following simple expression (Expression 3) when a sensitivity of deflection of the primary beam by the electric field is S_ex.

$$Lex = Vx \cdot S\_ex \quad \text{(Expression 3)}:$$

An amount Lbx of deflection of the primary beam by the magnetic field is given by the following simple expression (Expression 4).

$$Lbx = Ix \cdot S\_bx \quad \text{(Expression 4)}:$$

When Vx and Ix satisfy the Wine condition, $$Vx = K1 \cdot Ix,\ K1 \cdot S\_ex = S\_bx$$

Lex=Lbx is satisfied, the directions of deflection are opposite, and the scanning shift of the primary electron beam does not exist.

Meanwhile, when the circuit noises exist in a circuit block of the control circuit of the orthogonal electromagnetic deflector, the directions and the magnitudes of an electric field and a magnetic field generated by the circuit noises do not satisfy the Wien condition, so that the scanning shift of the primary electron beam occurs.

Figure 7:
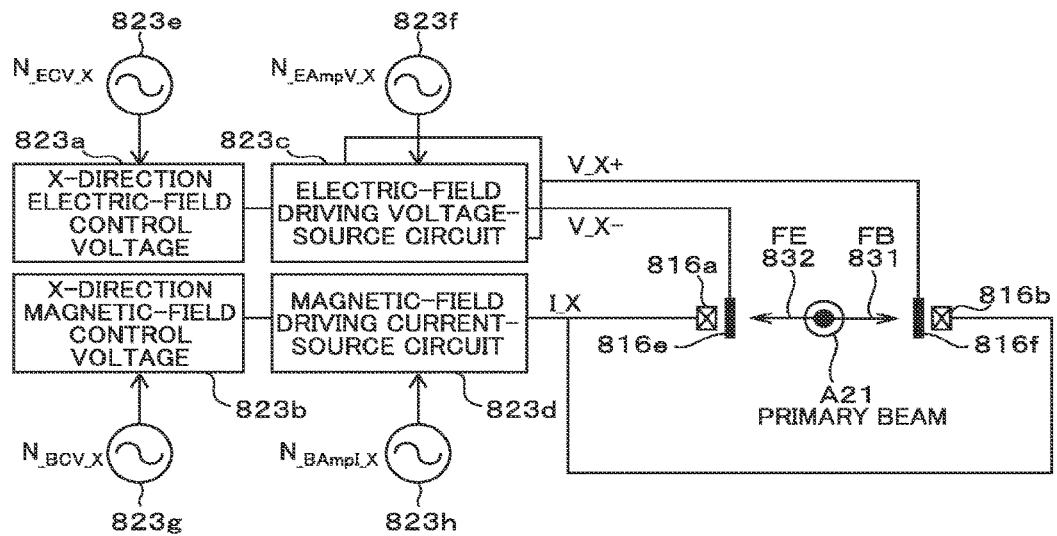
FIG. 7 is a block diagram showing the noises in the control circuit of the X-direction orthogonal electromagnetic deflector and the deflecting force for the primary beam in the conventional scanning electron beam type semiconductor metrology/inspection apparatus.

For example, as FIGS. 6 and 7 show, when a noise 823e of an X-direction electric-field control voltage is $N\_{ECV\_X}$ and a noise 823f of an electric-field driving voltage-source circuit is $N\_{EAmpV\_X}$, the shift amount of the primary electron beam caused by these random noises is represented by $$L\_{ENX} = ((N\_{ECV\_X} \times GE1 + N\_{EAmpV\_X} \times GE2) \times S\_ex \quad \text{(Expression 5)}:$$

Similarly, when a noise 823g of an X-direction magnetic-field control voltage is $N\_{BCV\_X}$ and a noise 823h of a magnetic-field driving current-source circuit is $N\_{BAmpI\_X}$, the shift amount of the primary electron beam caused by these noises is represented by $$L\_{BNX} = ((N\_{BCV\_X} \times GB1 + N\_{BAmpI\_X} \times GB2) \times S\_bx \quad \text{(Expression 6)}:$$

When the Wien condition is satisfied, the following relations are satisfied.

$$GE1/GB1 = GE2/GB2 = K1,\ K1 \cdot S\_ex = S\_bx$$

The shift amount of the primary electron beam caused by the orthogonal electromagnetic deflector is represented by Expression 7.

$$L\_{EXBNX} = ((N\_{ECV\_X} - N\_{BCV\_X}) \times GE1 + (N\_{EAmpV\_X} - N\_{BCV\_X}) \times GB2) \times S\_bx \quad \text{(Expression 7)}:$$

When the noise $N\_{ECV\_X}$ of the electric-field controlling voltage and the noise $N\_{BCV\_X}$ of the magnetic-field controlling voltage are the same in phase, they are canceled out. However, these noises are random and therefore the magnitude of the amount of the generated shift of the primary electron beam is represented by an effective value of the following Expression 8.

$$\delta L\_{EXBNX} = ((N\_{ECV\_X}^2 + N\_{BCV\_X}^2) \times GB1^2 + (N\_{EAmpV\_X}^2 + N\_{BAmpI\_X}^2) \times GB2^2)^{(0.5)} \times S\_bx \quad \text{(Expression 8)}:$$

For the above reasons, noise components in the electric-field deflector and the magnetic-field deflector in the noises in the control circuit of the orthogonal electromagnetic deflector, which have no correlation, mainly cause the scanning shift of the electron beam.

Therefore, for reducing the scanning shift of the electron beam, it is necessary to reduce the circuit noises applied to the electric-field deflector and the magnetic-field deflector, that has no no correlation, and to share a deflection control circuit by the electric-field deflector and the magnetic-field deflector.

In the following embodiments, configurations as to a unit separating the primary beam and the secondary beam used in the orthogonal electromagnetic deflector are described, in which the secondary electrons are deflected towards the detector by the electric field and the magnetic field is generated in a direction orthogonal to the electric field in such a manner that the effects of this electric field on the primary electron beam is canceled out and the secondary electrons are directed towards the detector.

First Embodiment

In the present embodiment, configurations as to the unit separating the primary beam and the second beam used in the orthogonal electromagnetic deflector are described, one of which enables a control signal generation unit of the voltage-source circuit controlling the electric-field deflector and a control signal generation unit of the current-source control circuit controlling the magnetic-field deflector to be formed as a common unit, and another of which adjusts a voltage signal controlling the electric field to satisfy the Wien condition with a current signal controlling the magnetic field as a reference.

A scanning electron beam metrology/inspection apparatus according to the present embodiment corresponds to an apparatus obtained by replacing the configuration of the control circuit of the orthogonal electromagnetic deflector for controlling the electric-field deflector and the magnetic-field deflector in the orthogonal electromagnetic deflector in the configuration of the conventional scanning electron beam metrology/inspection apparatus described in FIG. 8, with a configuration shown in FIG. 1. Therefore, the following description is made with reference to FIGS. 1 and 8.

The orthogonal electromagnetic deflector deflects secondary electrons or reflected electrons towards the detector, and therefore at least deflection electrodes and deflection coils provided in each of X-direction and Y-direction are usually necessary for controlling deflections in two orthogonal directions (X-direction and Y-direction) independently of each other.

For simplifying the description, FIG. 1 only shows blocks corresponding to an electric-field deflector and a magnetic-field deflector in X-direction and a voltage control circuit and a current control circuit thereof. A configuration in Y-direction is the same as that in the present embodiment.

An operation of the scanning electron beam metrology/inspection apparatus according to the present embodiment is described with reference to the apparatus configuration in FIG. 8. In the inside of the lens barrel 830 (in the vacuum state), the electron beam A21 generated and emitted by the electron gun 801 is concentrated through the first condenser lens (the concentrating lens) 802, the diaphragm 803, and the second condenser lens (the concentrating lens) 804, travels within an electric field formed by the deflection electrode 808 and is subjected to scanning deflection control in accordance with a deflection voltage applied to the deflection electrode 808, and is radiated onto the sample 810 through the objective lens 809, for example, while the sample 810 is scanned with the electron beam. When the beam A24 is radiated, the secondary electrons A211 are generated from the sample 810. The secondary electrons A211 are deflected by the electric field and the magnetic field by the orthogonal electromagnetic deflector 816, and are detected by a detector 807. A signal (an analog signal) detected by the detector 807 is converted to a digital signal by the signal detection unit (the secondary-electron signal detection circuit) 827. A two-dimensional image is generated and processed based on the digital signal by the image processing unit) (the secondary-electron signal processing circuit) 828, and is displayed on a screen of a GUI unit 826. A circuit pattern is measured based on this image (in a case of a metrology function).

Next, a configuration of a control circuit of the orthogonal electromagnetic deflector, controlling an electric-field deflector and a magnetic-field deflector, according to the present embodiment is described with reference to FIGS. 1 and 8.

The secondary electrons (or the reflected electrons) A211 generated from the sample 810 by radiation of the primary electron beam A21 are subjected to forces from magnetic-field deflectors 116a and 116b and electric-field deflectors 116e and 116f, that constitute the orthogonal electromagnetic deflector 816, to be deflected towards the detector 807 and be detected by the detector 807. A deflection angle of the detected secondary beam (the secondary electrons or the reflected electrons) A211 is proportional to intensities of the electric field and the magnetic field generated by the orthogonal electromagnetic deflector 816 and is inversely proportional to the energy of the secondary beam A211. Because the secondary beam having different energies of the secondary electrons or the reflected electrons from the sample is incident on the detector mounted at a fixed position, the magnitudes of the electric field and the magnetic field generated by the orthogonal electromagnetic deflector 816 an output voltage and an output current of a control circuit 302 for the orthogonal electromagnetic deflector are controlled.

Meanwhile, an output voltage Vx of a voltage-source circuit controlling the electric field and an output current Ix of a current-source circuit controlling the magnetic field satisfy the Wien condition so that the electric field and the magnetic field generated by the orthogonal electromagnetic deflector 816 do not affect a scanning position of the primary electron beam A21.

The control circuit 302 for the orthogonal electromagnetic deflector generates a voltage value 302a1 determining the deflection angle of the secondary beam in accordance with the energy of the secondary beam A211, from an electric-field/magnetic-field common voltage generation unit 302a. The generated voltage value is converted to a current controlling the magnetic field and is amplified by a magnetic-field driving current-source circuit 302c, and is then applied to the magnetic-field deflectors 116a and 116b. Also, the voltage value 302a1 is adjusted by a gain adjustment unit 302b so that the output voltage Vx of the voltage-source circuit controlling the electric field and the output current Ix of the current-source circuit controlling the magnetic field satisfy the Wien condition, amplified to a voltage controlling the electric field by an electric-field driving voltage-source circuit 302c, and then applied to the electric-field deflectors 116e and 116f.

With this configuration, main portions of control-circuit noises in the orthogonal electromagnetic deflector, which cause a position shift of the primary electron beam A21 in the conventional apparatus configuration, become the same phase components that are common to the electric-field control circuit and the magnetic-field control circuit, the vibration directions of the electric field and the magnetic field caused by those portions of the noises are opposite to each other, and the magnitudes satisfy the Wien condition. Further, frequency characteristics and phase characteristics of a voltage-source control signal and those of a current-source control signal are coincident with each other.

Therefore, as for a deflection force acting on the primary electron beam caused by the common-circuit noises of the control circuits for the electromagnetic deflector, a noise portion of the electric-field deflector and that of the magnetic-field deflector can be cancelled out, so that the position shift of the primary electron beam can be reduced.

As described above, according to the present embodiment, it is possible to achieve a high voltage and a large current in the unit separating the primary electrons and the secondary electrons from each other, minimize the variation effects on the primary beam, and improve a resolution and a throughput in the semiconductor (sample) metrology/inspection apparatus and method using the scanning electron beam technique.

Second Embodiment

A scanning electron beam metrology/inspection apparatus and a metrology/inspection method using the same according to the second embodiment of the present invention are described with reference to FIG. 2, in comparison with the conventional example.

In the present embodiment, a unit in which orthogonal electromagnetic deflectors that separate primary electrons and secondary electrons and deflect a secondary beam are provided in two or more stages. FIG. 2 shows a case of a two-stage configuration.

This two-stage secondary beam deflecting unit has a feature of capable of solving a problem of chromatic aberration of a primary electron beam in a single-stage secondary beam deflecting unit.

The configuration in the second embodiment and an operation of correcting the chromatic aberration are described below.

[Metrology/Inspection Apparatus (System)]

Figure 2:
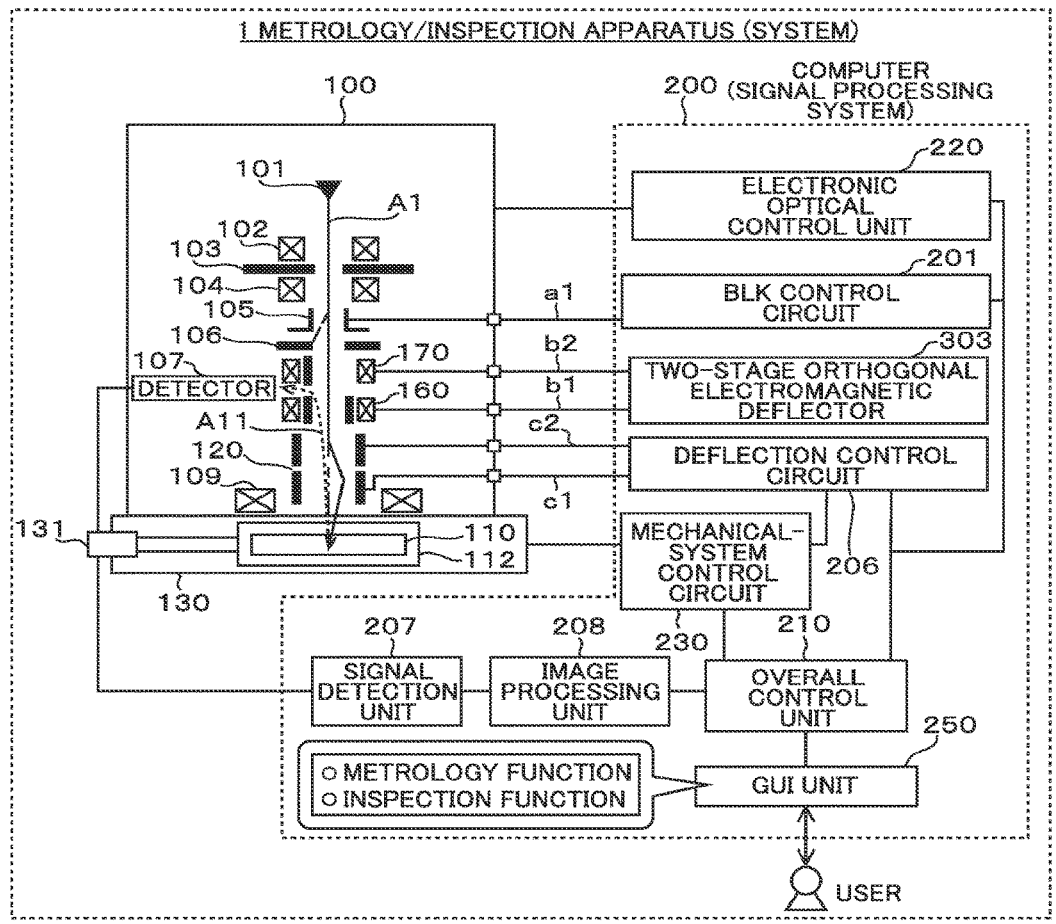
FIG. 2 is a block diagram schematically showing a configuration of an apparatus using a two-stage orthogonal electromagnetic deflector and a control circuit of the orthogonal electromagnetic deflector according to a second embodiment of the present invention.

A configuration of a whole system including the metrology/inspection apparatus in this second embodiment is shown in FIG. 2. The metrology/inspection apparatus 1 in the second embodiment is an example of an application that enables automatic measurement and automatic inspection for semiconductor wafer as an object (a sample 110). This metrology/inspection apparatus 1 has a measurement function of measuring dimension values in a circuit pattern on the semiconductor wafer (the sample 110) and an inspection function of detecting a defect (an abnormality or a failure) in that pattern.

This metrology/inspection apparatus (system) 1 is roughly formed by a scanning electron microscope 100 and a computer 200 for signal processing and control.

The scanning electron microscope 100 includes a column 150 and a sample chamber 130. A sample stage (stage) 112 on which the sample 110 that is an object of measurement and inspection is to be placed and a motor 131 driving this sample stage are provided in the inside of the sample chamber 130.

Inside the column 150 (in a vacuum state) of the scanning electron microscope 100, an electron gun 101 emitting an electron beam A1, a concentrating lens (a first condenser lens) 102, a diaphragm 103, a concentrating lens (a second condenser lens) 104, a blanking (BLK) control electrode 105, an aperture 106, a deflector (an electrode) 120, and an objective lens 109 through which the emitted electron beam A1 passes are provided, for example, as a radiation system (an electronic optical system).

The column 150 includes a detector 107 detecting secondary electrons/reflected electrons A11 generated from the sample 110 by the radiated electron beam A1 (A4), and a secondary electrons/reflected electrons orthogonal electromagnetic deflector 160 deflecting the A11 towards the detector 107 as a detection system. A deflector 170 is an orthogonal electromagnetic deflector correcting chromatic aberration of a primary electron beam A1 (A4) generated by the deflector 160. The electron beams A1 and A4 (not shown) respectively correspond to the electron beams A21 and A24 shown in FIG. 8.

The computer 200 has a configuration that is stored in form of a PC or a control board in a control rack, for example. Each unit of the computer 200 is achieved by software program processing by a processor and a memory, for example, or processing by a dedicated circuit.

The computer 200 includes an overall control unit 210, a blanking (BLK) control circuit 201, an image-shift/deflection control circuit 206 controlling a position shift and deflection of an electron beam and scanning with the electron beam, a mechanical-system control unit 230, a signal detection unit (a secondary-electron signal detection circuit) 207, an image processing unit (a secondary-electron signal processing circuit) 208, and a GUI unit (a user interface unit) 250, for example.

Inside the column 150 (in the vacuum state) of the scanning electron microscope 100, the electron beam A1 generated and emitted by the electron gun 101 is concentrated thorough the first condenser lens (the concentrating lens) 102, the diaphragm 103, and the second condenser lens (the concentrating lens) 104, subjected to movement and scan-deflection control at a radiation center of the beam by means of the deflector 120 in which image shifting and scanning are integrated, and radiated onto the sample 110 through the objective lens 109, for example, while the sample 110 is scanned with the beam. When the beam A1 (A4) is radiated, the secondary electrons A11 are generated from the sample 110, and are detected by the detector 107. A signal (an analog signal) output from the detector 107 by the detection of the secondary electrons A11 is converted to a digital signal by the signal detection unit (the secondary-electron signal detection circuit) 207. A two-dimensional image is generated and processed based on that digital signal by the image processing unit (the secondary-electron signal processing circuit) 208, and a result of the processing is displayed on a GUI screen. A circuit pattern is measured based on this image (in a case of the measurement function).

The GUI unit 250 performs a process that provides an interface (e.g., GUI screens) to a user (a measurer/inspector). The GUI unit 250 provides a GUI screen allowing an inspection condition to be input (set) and a GUI screen displaying an inspection result (e.g., a two-dimensional image). The GUI unit 250 includes an input/output device such as a keyboard and a display, and a communication interface unit. The user can select and perform the measurement function and the inspection function on the GUI screen.

The overall control unit 210 performs a process of controlling the whole of this system (apparatus) (e.g., an electronic optical control unit 220, the mechanical-system control unit 230, the image-shift/deflection control circuit 206, the signal detection unit 207, the image processing unit 208, and a stage-position detection unit) in accordance with an instruction in the GUI unit 250. For example, the overall control unit 210 controls the electronic optical control unit 220, the image-shift/deflection control circuit 206, the mechanical-system control unit 230, and the like in accordance with a measurement/inspection condition or an instruction input by the user on the screen of the GUI unit 250, thereby performing a measurement process. For example, while the measurement is performed, the overall control unit 210 receives data information, such as the two-dimensional image generated through the signal processing unit 207 and the image processing unit 208, and makes the data information be displayed on the screen of the GUI unit 250.

The electronic optical control unit 220 controls the electronic optical system (the radiation system) in the column 100, e.g., the electron gun 101, the first condenser lens (the concentrating lens) 102, the diaphragm 103, the second condenser lens (the concentrating lens) 104, the blanking control electrode 105, and the objective lens 109 in accordance with the control from the overall control unit 210. The blanking control circuit 201 controls the blanking control electrode 105 via a signal line, to bend the path of the electron beam A1 so that the electron beam A1 is radiated to the aperture 106 when radiation of the electron beam A1 onto the sample 110 is stopped.

The image-shift/deflection control circuit 206 applies a deflection control signal to the deflector 120 through signal lines (c1 and c2) in accordance with the control from the overall control unit 210, to shift the position of the electron beam and control scanning by deflection at this shifted position.

A control unit of the two-stage orthogonal electromagnetic deflector 303 applies a secondary-beam deflection control signal to the orthogonal electromagnetic deflector 160 that separates the primary beam and the secondary beam from each other, through a signal line (b1) in accordance with the control from the overall control unit 210, thereby deflecting the secondary electrons/reflected electrons towards the detector 107 and performing control in such a manner that the secondary electrons/reflected electrons do not affect a scanning direction of the primary electron beam.

However, such an orthogonal electromagnetic field generator causes energy dispersion of the primary electron beam by the same operation as that of a Wien filter energy spectrometer, and therefore has a major problem of chromatic aberration because of generation of a large deflecting force. Thus, the two-stage orthogonal electromagnetic deflector control unit 303 applies a primary-electron-beam chromatic-aberration correction control signal to the orthogonal electromagnetic deflector 170 via a signal line (b2) in accordance with the control from the overall control unit 210, thereby generating an opposite electric field and a magnetic field to control correction of chromatic aberration of the primary electron beam simultaneously generated with large deflection of the secondary beam by the orthogonal electromagnetic deflector 160.

Figure 9:
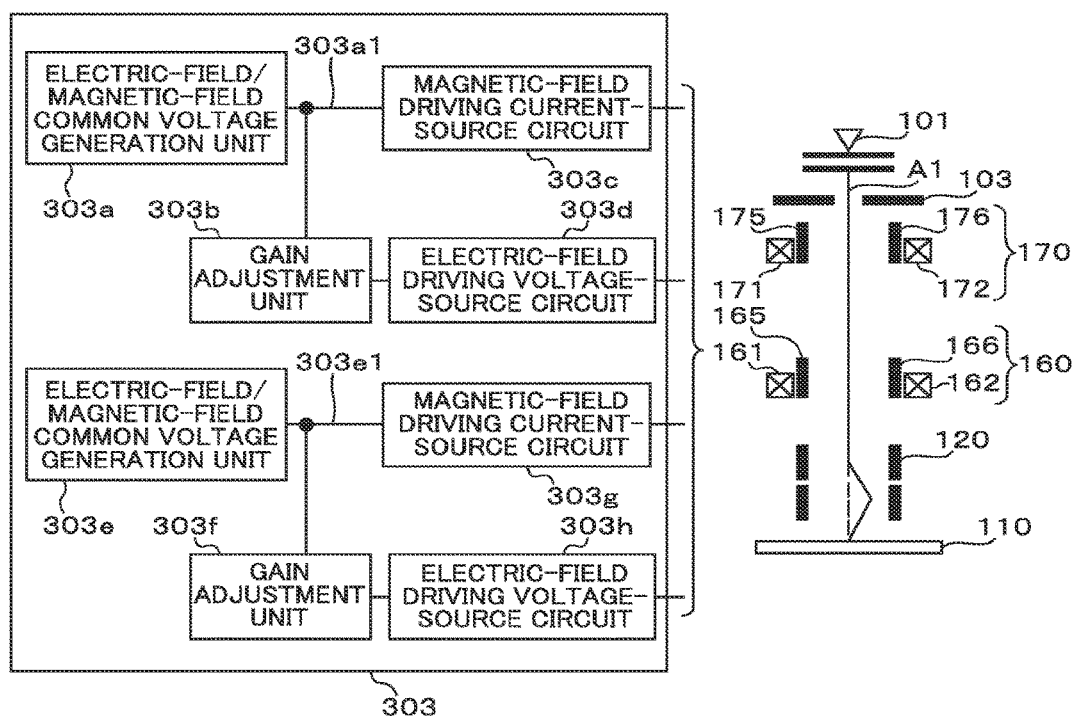
FIG. 9 is a block diagram showing a configuration of the two-stage orthogonal electromagnetic deflector and the control circuit thereof according to the second embodiment of the present invention.

FIG. 9 is a block diagram showing the two-stage orthogonal electromagnetic deflector 303 and the control circuit thereof according to the second embodiment of the present invention.

As shown in FIG. 9, formed by a portion controlling the upstream deflector 170 of the two-stage orthogonal electromagnetic deflector and a portion controlling the downstream deflector 160. In order to minimize the effect on the position shift of the primary electron beam, the configuration of the control circuit for each stage is the same as that described in the first embodiment, and a signal generation unit of a voltage-source circuit and that of a current-source circuit are formed as a common unit.

Further, frequency characteristics and phase characteristics of a voltage-source control signal and those of a current-source control signal are made coincident with each other. Therefore, for a deflecting force acting on the primary electron beam caused by common-circuit noises in the electromagnetic-deflector control circuit for each stage, portions by electric-field deflectors and magnetic-field deflectors can be canceled out, so that the position shift of the primary electron beam can be reduced.

As an example of a unit that makes the frequency characteristics and the phase characteristics coincident, a filter may be provided in each output stage of the voltage-source circuit and the current-source circuit in such a manner that frequency bands and attenuation characteristics of each circuit are the same. This makes it possible to match the phase/frequency characteristics of the noises generated by the voltage-source circuit and the current-source circuit at the common control signal portion.

Returning to FIG. 2, the mechanical-system control unit 230 controls a mechanical system including a motor 131 that drives the sample stage 112 arranged in the sample chamber 130 and the like. For example, it is possible to drive the motor 131 to correspond to control of scanning with the electron beam, thereby performing movement control of the sample stage 112. A rotation signal of the motor 131 is sent to the stage-position detection unit (not shown), so that position information of the sample stage 112 is obtained.

Although the computer 200 (the overall control unit 210 and the like) of FIG. 2 has both the measurement function and the inspection function, it may have only one of those functions. The image processing unit 208 generates a measurement image, calculates pattern dimension values in that image, for example, during measurement (in a case of the metrology function) and generates an inspection image, performs a process of detecting and determining a defect within that image, for example, during inspection (in a case of the inspection function).

According to the present embodiment, for improving a throughput and a measurement accuracy as to the semiconductor (sample) metrology/inspection apparatus and method using the scanning electron beam technique, the unit separating the primary beam and the secondary beam from each other is formed by the orthogonal electromagnetic deflectors in the two-stage configuration. Thus, a high voltage and a large current can be achieved in the unit separating the primary electrons and the secondary electrons, and a fluctuation effect on the primary beam and aberration can be minimized, so that a resolution and the throughput can be improved.

Third Embodiment

Although the configuration described in the first embodiment only shows X-direction (or Y-direction) of the orthogonal electromagnetic deflector, a configuration of a scanning electron beam metrology/inspection apparatus in the present embodiment includes an orthogonal electromagnetic deflector and a control circuit thereof in both X-direction and Y-direction.

Figure 10:
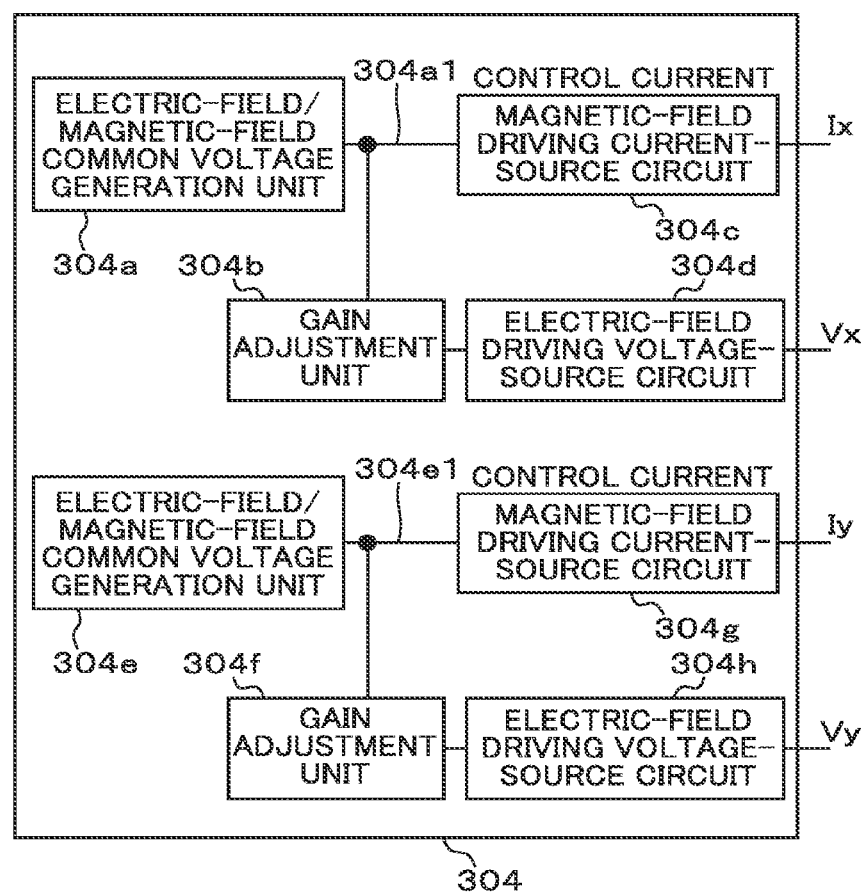
FIG. 10 is a block diagram showing a configuration of a control circuit of an orthogonal electromagnetic deflector according to a third embodiment of the present invention.

FIG. 10 is a block diagram showing the configuration of the control circuit of the orthogonal electromagnetic circuit according to the third embodiment of the present invention.

As shown in FIG. 10, the control circuit of the orthogonal electromagnetic deflector described in the first embodiment is changed, in the present embodiment, to be formed by the voltage-source circuit and the current-source circuit that control the electric field and the magnetic field of the orthogonal electromagnetic deflector in each of X- and Y-directions. The signal generation units of the voltage-source circuit and the current-source circuit are formed as a common unit in each direction in order to minimize a position-shift effect on the primary electron beam. Further, in each direction, frequency characteristics and phase characteristics of the voltage-source control signal and those of the current-source control signal are coincident with each other. Therefore, for the deflecting force acting on the primary electron beam caused by the common-circuit noises in the control circuits for the orthogonal electromagnetic deflector in each direction, the portions of electric-field deflectors and the portions of magnetic-field deflectors can be canceled out, so that the position shift of the primary electron beam can be reduced.

According to the present embodiment, for improving a throughput and measurement accuracy as to the semiconductor (sample) metrology/inspection apparatus and method using the scanning electron beam technique, the orthogonal electromagnetic deflector is provided in each of X- and Y-directions as the unit separating the primary beam and the secondary beam. Thus, a high voltage and a large current can be achieved in the unit separating the primary electrons and the secondary electrons, and a fluctuation effect on the primary beam and aberration can be minimized, so that a resolution and the throughput can be improved.

Fourth Embodiment

Although the orthogonal electromagnetic deflector and the control circuit thereof are provided in both X- and Y-directions in the configuration described in the third embodiment, that configuration has a feature that control of a control voltage and a control current in each direction is independently performed.

In the configuration of a scanning electron beam metrology/inspection apparatus in the present embodiment, an orthogonal electromagnetic deflector and a control circuit thereof are provided in both X- and Y-directions. Also, control of a control voltage and a control current in X-direction is not independent of control of those in Y-direction. An electric field and a magnetic field that are generated in each of X- and Y-directions independently are not orthogonal because of manufacturing/mounting errors of electrodes and coils in X-direction and those in Y-direction, and it is therefore necessary to correct a rotation effect.

Figure 11:
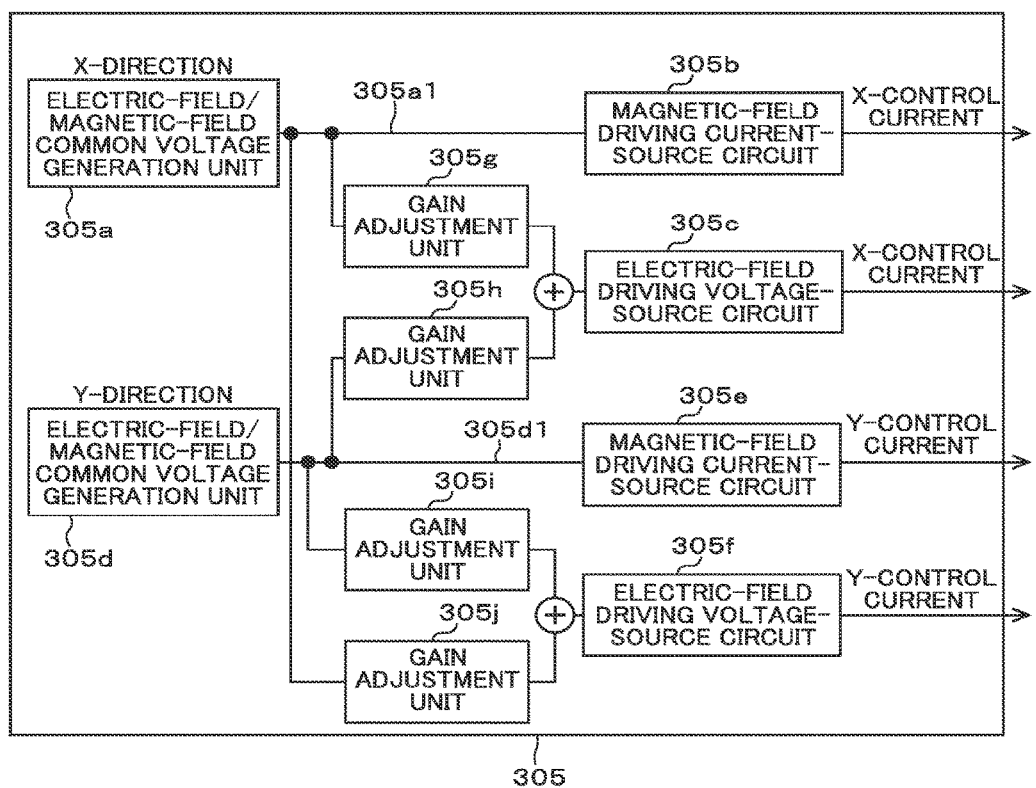
FIG. 11 is a block diagram showing a configuration of a control circuit of an orthogonal electromagnetic deflector according to a fourth embodiment of the present invention.

FIG. 11 is a block diagram showing the configuration of the control circuit of the orthogonal electromagnetic deflector according to the fourth embodiment of the present invention.

As shown in FIG. 11, the control circuit of the orthogonal electromagnetic deflector is formed by a voltage-source circuit and a current-source circuit that control an electric field and a magnetic field of the orthogonal electromagnetic deflector in X-direction and those in Y-direction.

The orthogonal electromagnetic deflector control circuit 305 is formed by an X-direction orthogonal-electromagnetic-deflector control unit and a Y-direction electric-field/magnetic-field orthogonal-electromagnetic-deflector control unit. The X-direction orthogonal-electromagnetic-deflector control unit generates a voltage value 305$a$1 determining an X-direction deflection angle of a secondary beam in accordance with an energy of the secondary beam, from an X-direction electric-field/magnetic-field common voltage generation unit 305$a$. The Y-direction orthogonal-electromagnetic-deflector control unit generates a voltage value 305$d$1 determining a Y-direction deflection angle of the secondary beam in accordance with the energy of the secondary beam, from a Y-direction electric-field/magnetic-field common voltage generation unit 305$d$. The generated X-direction common voltage value 305$a$1 is converted to a current controlling an X-direction magnetic field and is amplified in an X-direction magnetic-field driving current-source circuit 305$b$, and is then applied to an X-direction magnetic-field deflector. The generated Y-direction common voltage value 305$d$1 is converted to a current controlling a Y-direction magnetic field and is amplified in a Y-direction magnetic-field driving current-source circuit 305$e$, and is then applied to a Y-direction magnetic-field deflector.

Meanwhile, for correcting rotation effects of the X-direction deflector and the Y-direction deflector, as an output voltage Vx of a voltage-source circuit controlling an X-direction electric filed, the X-direction common voltage value 305$a$1 and the Y-direction common voltage value 305$d$1 are input to an electric-field driving voltage-source circuit 305$c$ with adjustment results in gain adjustment units 305$g$ and 305$h$ respectively added thereto, and are amplified to a voltage controlling the electric field by the electric-field driving voltage-source circuit 305$c$, so that the amplified voltage is applied to an X-direction deflector.

Similarly, for correcting the rotation effects of the X-direction deflector and the Y-direction deflector, as an output voltage Vy of a voltage-source circuit controlling a Y-direction electric filed, the X-direction common voltage value 305$a$1 and the Y-direction common voltage value 305$d$1 are input to an electric-field driving voltage-source circuit 305$f$ with adjustment results in gain adjustment units 305$i$ and 305$j$ respectively added thereto, and amplified to a voltage controlling the electric field by the electric-field driving voltage-source circuit 305$f$, so that the amplified voltage is applied to a Y-direction deflector.

With this configuration, even in a case where the rotation effects of the X- and Y-direction electromagnetic deflectors exist, a main portion of noises in the electromagnetic deflector control circuits, causing a position shift of a primary electron beam, becomes the same phase component common to the electric-field control circuit and the magnetic-field control circuit, vibration directions of the electric field and the magnetic field caused by the noises of this portion are opposite to each other, and the magnitudes satisfy the Wien condition. Further, the frequency characteristics and the phase characteristics of a voltage-source control signal and those of a current-source control signal are made coincident.

According to the present embodiment, for improving a throughput and measurement accuracy as to the semiconductor (sample) metrology/inspection apparatus and method using the scanning electron beam technique, the primary beam/secondary beam separation unit is formed by the orthogonal electromagnetic deflector that can correct the rotation effects of the X- and Y-direction electromagnetic deflectors. Thus, a high voltage and a large current can be achieved in the unit separating the primary electrons and the secondary electrons and a fluctuation effect on the primary beam and aberration can be minimized, so that a resolution and the throughput can be improved.

The invention made by the inventors has been specifically described based on the embodiments in the above description. However, it goes without saying that the present invention is not limited to the aforementioned embodiments but can be changed in various ways without departing from the summary of the invention.

Main features of a charged particle beam device according to the present invention, provided by the above configurations, are as follows.

(1) A charged particle beam device includes:
a charged particle gun that generates a charged particle beam;
an electronic optical system that radiates the charged particle beam emitted from the charged particle gun onto a sample placed on a stage and performs scanning with the charged particle beam;
a detection unit that detects secondary electrons or reflected electrons generated from the sample; and
an orthogonal electromagnetic deflection unit that deflects a traveling path of the secondary electrons or the reflected electrons towards the detection unit,
wherein the orthogonal electromagnetic deflection unit includes a magnetic-field deflector generating a magnetic field to change a path of the charged particle beam, an electric-field deflector generating an electric field to change the path of the charged particle beam, a current-source circuit supplying a current to the magnetic-field deflector, a voltage-source circuit supplying a voltage to the electric-field deflector, and a gain adjustment unit adjusting a relation between the current and the voltage,
the magnetic-field deflector and the electric-field deflector are arranged in such a manner that the magnetic field and the electric field are orthogonal to each other and overlap each other,
a voltage generation unit applying a voltage to the current-source circuit and a voltage generation unit applying a voltage to the voltage-source unit are formed as a one common unit, and
the relation between the current and the voltage is adjusted by the gain adjustment unit in such a manner that an amount of deflection of the traveling path by the magnetic field is coincident with an amount of deflection of the traveling path by the electric field.

(2) A charged particle beam device includes:
a charged particle gun that generates a charged particle beam;
an electronic optical system that radiates the charged particle beam emitted from the charged particle gun onto a sample placed on a stage and perform scanning with the charged particle beam;
a detection unit that detects secondary electrons or reflected electrons generated from the sample; and
an orthogonal electromagnetic deflection unit that deflects a traveling path of the secondary electrons or the reflected electrons towards the detection unit,
wherein the orthogonal electromagnetic deflection unit includes a first electric-field deflector and a first magnetic-field deflector that respectively apply an electric field and a magnetic field in a first direction crossing a traveling direction of the charged particle beam emitted from the charged particle gun, a second electric-field deflector and a second magnetic-field deflector that respectively apply an electric field and a magnetic field in a second direction orthogonal to the first direction, first and second current-source circuits respectively supplying currents to the first and second magnetic-field deflectors, first and second voltage-source circuits respectively supplying voltages to the first and second electric-field deflectors, and first and second gain adjustment units each adjusting a relation between the current and the voltage,
the first and second magnetic-field deflectors generate the magnetic fields to change a path of the charged particle beam, and the first and second electric-field deflectors generate the electric fields to change the path of the charged particle beam,
the first and second magnetic-field deflectors and the first and second electric-field deflectors are arranged in such a manner that each of the magnetic fields and a corresponding one of the electric fields are orthogonal to each other and overlap each other,
a first voltage generation unit is provided that is a common unit of a voltage generation unit applying a voltage to the first current-source circuit and a voltage generation unit applying a voltage to the first voltage-source circuit,
a second voltage generation unit is provided that is a common unit of a voltage generation unit applying a voltage to the second voltage-source circuit and a voltage generation unit applying a voltage to the second voltage-source circuit,
the first voltage generation unit and the second voltage generation unit control the voltages independently of each other,
the relation between the current and the voltage is adjusted by the first gain adjustment unit in such a manner that an amount of deflection of the traveling path by the magnetic field of the first magnetic-field deflector is coincident with an amount of deflection of the traveling path by the electric field of the first electric-field deflector, and
the relation between the current and the voltage is adjusted by the second gain adjustment unit in such a manner that an amount of deflection of the traveling path by the magnetic field of the second magnetic-field deflector is coincident with an amount of deflection of the traveling path by the electric field of the second electric-field deflector.

LIST OF REFERENCE SIGNS

1: metrology/inspection apparatus (system),
100: scanning electron microscope (column),
101: electron gun,
102: concentrating lens (a first condenser lens),
103: diaphragm,
104: second condenser lens (concentrating lens),
105: blanking (BLK) control electrode,
106: aperture,
107: detector (secondary electrons/reflected electrons detector),
109: objective lens,
110: sample,
112: sample stage (stage),
120: deflector,
160: orthogonal electromagnetic deflector,
200: computer (signal processing system),
201: blanking (BLK) control circuit,
206: image-shift/deflection control circuit,
207: signal detection unit (a secondary-electron signal detection circuit),
208: image processing unit (a secondary-electron signal processing circuit),
210: overall control unit,
220: electronic optical control unit,
230: mechanical-system control unit,
250: GUI unit,
303: orthogonal electromagnetic deflector,
302: control circuit for orthogonal electromagnetic deflector.

The invention claimed is:
1. A charged particle beam device comprising:
a charged particle gun that generates a charged particle beam;
an electronic optical system that radiates the charged particle beam emitted from the charged particle gun onto a sample placed on a stage and performs scanning with the charged particle beam;
a detection unit that detects secondary electrons or reflected electrons generated from the sample; and
an orthogonal electromagnetic deflection unit that deflects a traveling path of the secondary electrons or the reflected electrons towards the detection unit,
wherein the orthogonal electromagnetic deflection unit includes a magnetic-field deflector generating a magnetic field to generate a force to change a path of the charged particle beam, an electric-field deflector generating an electric field to generate a force to change the path of the charged particle beam,
wherein the charged particle beam device includes a current-source circuit supplying an output current to the magnetic-field deflector, a voltage-source circuit supplying an output voltage to the electric-field deflector, and a gain adjustment unit for adjusting a relation between the output current and the output voltage, and a common voltage generation unit,
wherein the magnetic-field deflector and the electric-field deflector are arranged in such a manner that the magnetic field and the electric field are orthogonal to each other and overlapped with each other,
wherein, through the gain adjustment unit, the common voltage generation unit applies a voltage to the current-source circuit and a voltage to the voltage-source circuit,
wherein the relation between the output current and the output voltage is adjusted by the gain adjustment unit in such a manner that an amount of the force to change the path of the charged particle beam by the magnetic field is coincident with an amount of the force to change the path of the charged particle beam by the electric field, and
wherein a frequency characteristic of the supplied current is coincident with a frequency characteristic of the supplied voltage.

2. A charged particle beam device comprising:
a charged particle gun that generates a charged particle beam;
an electronic optical system that radiates the charged particle beam emitted from the charged particle gun onto a sample placed on a stage and performs scanning with the charged particle beam;
a detection unit that detects secondary electrons or reflected electrons generated from the sample; and
first and second orthogonal electromagnetic deflection units that deflect a traveling path of the secondary electrons or the reflected electrons towards the detection unit,
wherein both of the first and second orthogonal electromagnetic deflection units include a first magnetic-field deflector generating a magnetic field to generate a force to change a path of the charged particle beam, and an electric-field deflector generating an electric field to generate a force to change the path of the charged particle beam,
wherein the charged particle beam device includes a first current-source circuit supplying a first output current to the magnetic-field deflector of the first orthogonal electromagnetic deflection unit, a first voltage-source circuit supplying a first output voltage to the electric-field deflector of the first orthogonal electromagnetic deflection unit, a first gain adjustment unit for adjusting a first relation between the first output current and the first output voltage, and a first common voltage generation unit,
wherein the charged particle beam device includes a second current-source circuit supplying a second output current to the magnetic-field deflector of the second orthogonal electromagnetic deflection unit, a second voltage-source circuit supplying a second output voltage to the electric-field deflector of the second orthogonal electromagnetic deflection unit, a second gain adjustment unit for adjusting a second relation between the second output current and the second output voltage, and a second common voltage generation unit,
wherein the magnetic-field deflector and the electric-field deflector are arranged in such a manner that the magnetic field and the electric field are orthogonal to each other and overlapped each other, for each of the first and second orthogonal electromagnetic deflection units,
wherein, through the first gain adjustment unit, the first common voltage generation unit applies a voltage to the first current-source circuit and a voltage to the first voltage-source circuit,
wherein, through the second gain adjustment unit, the second common voltage generation unit applies a voltage to the second current-source circuit and a voltage to the second voltage-source circuit,
wherein the first relation between the first output current and the first output voltage is adjusted by the first gain adjustment unit in such a manner that an amount of the force to change the path of the charged particle beam by the magnetic field generated by the magnetic-field deflector of the first orthogonal electromagnetic deflection unit is coincident with an amount of the force to change the path of the charged particle beam by the electric field generated by the electric-field deflector of the first orthogonal electromagnetic deflection unit, and
wherein the second relation between the second output current and the second output voltage is adjusted by the second gain adjustment unit in such a manner that an amount of the force to change the path of the charged particle beam by the magnetic field generated by the magnetic-field deflector of the second orthogonal electromagnetic deflection unit is coincident with an amount of the force to change the path of the charged particle beam by the electric field generated by the electric-field deflector of the second orthogonal electromagnetic deflection unit.

3. The charged particle beam device according to claim 2, wherein the first orthogonal electromagnetic deflection unit is arranged above the second orthogonal electromagnetic deflection unit.

4. The charged particle beam device according to claim 2, wherein a deflection direction of the first orthogonal electromagnetic deflection unit is different to a deflection direction of the second orthogonal electromagnetic deflection unit.

5. The charged particle beam device according to claim 4, wherein the first common voltage generation unit applies a voltage to the second voltage-source circuit, through a third gain adjustment unit of the second orthogonal electromagnetic deflection unit, and
wherein the second common voltage generation unit applies a voltage to the first voltage-source circuit, through a fourth gain adjustment unit of the first orthogonal electromagnetic deflection unit.

6. The charged particle beam device according to claim 2, further comprising:
a third gain adjustment unit of the first orthogonal electromagnetic deflection unit and a fourth gain adjustment unit of the second orthogonal electromagnetic deflection unit, each for correcting a rotation effect by the first and second orthogonal electromagnetic deflection units.

* * * * *